United States Patent
Bojkov et al.

(10) Patent No.: US 11,877,505 B2
(45) Date of Patent: Jan. 16, 2024

(54) FLUORINATED POLYMERS WITH LOW DIELECTRIC LOSS FOR ENVIRONMENTAL PROTECTION IN SEMICONDUCTOR DEVICES

(71) Applicant: Qorvo US, Inc., Greensboro, NC (US)

(72) Inventors: Christo Bojkov, Plano, TX (US); Michael Roberg, Evergreen, CO (US); Matthew Essar, Wylie, TX (US); Walid Meliane, Frisco, TX (US); Terry Hon, Plano, TX (US)

(73) Assignee: Qorvo US, Inc., Greensboro, NC (US)

( * ) Notice: Subject to any disclaimer, the term of this patent is extended or adjusted under 35 U.S.C. 154(b) by 125 days.

(21) Appl. No.: 17/501,111

(22) Filed: Oct. 14, 2021

(65) Prior Publication Data

US 2022/0123216 A1    Apr. 21, 2022

Related U.S. Application Data (60) Provisional application No. 63/092,282, filed on Oct. 15, 2020.

(51) Int. Cl.
| | | |
|---|---|---|
| *H01L 35/24* | (2006.01) | |
| *H01L 51/00* | (2006.01) | |
| *H10K 85/10* | (2023.01) | |
| *H01L 23/00* | (2006.01) | |
| *H10K 71/10* | (2023.01) | |

(52) U.S. Cl.
CPC ............ *H10K 85/115* (2023.02); *H01L 24/03* (2013.01); *H01L 24/48* (2013.01); *H10K 71/10* (2023.02); *H01L 2224/43827* (2013.01); *H01L 2224/48091* (2013.01); *H01L 2224/48228* (2013.01); *H01L 2224/73265* (2013.01)

(58) Field of Classification Search
CPC ........... H01L 24/48; H01L 2224/43827; H01L 2224/48091; H01L 2224/48228; H01L 2224/73265
USPC .......................................................... 257/40
See application file for complete search history.

(56) References Cited

U.S. PATENT DOCUMENTS

| | | |
|---|---|---|
| 6,564,449 B1 | 5/2003 | Tsai et al. |
| 9,659,898 B1 | 5/2017 | Railkar et al. |
| (Continued) | | |

OTHER PUBLICATIONS

Author Unknown, "Vectra: liquid crystal polymer (LCP)," Product Information, Oct. 2007, Ticona GmbH, 80 pages.

(Continued)

*Primary Examiner* — Caleb E Henry
*Assistant Examiner* — Dilinh P Nguyen
(74) *Attorney, Agent, or Firm* — Withrow & Terranova, P.L.L.C.

(57) ABSTRACT

Semiconductor devices, and more particularly arrangements of fluorinated polymers with low dielectric loss for environmental protection in semiconductor devices are disclosed. Arrangements include conformal coatings or layers of fluorinated polymers that cover a semiconductor die on a package substrate of a semiconductor device. Such fluorinated polymer arrangements may also conformally coat various electrical connections for the semiconductor die, including wire bonds. Fluorinated polymers with low dielectric constants and low moisture permeability may thereby provide reduced moisture ingress in semiconductor devices while also reducing the impact of associated dielectric loss.

16 Claims, 5 Drawing Sheets

(56) References Cited

U.S. PATENT DOCUMENTS

| | | | |
|---|---|---|---|
| 10,651,103 | B2 | 5/2020 | Bojkov et al. |
| 10,832,984 | B2 | 11/2020 | Bojkov et al. |
| 2004/0217453 | A1 | 11/2004 | Ogino et al. |
| 2006/0091536 | A1 | 5/2006 | Huang et al. |
| 2006/0216603 | A1 | 9/2006 | Choi |
| 2007/0160846 | A1 | 7/2007 | Koinuma et al. |
| 2008/0179757 | A1 | 7/2008 | Yamamori et al. |
| 2010/0096659 | A1 | 4/2010 | Noma |
| 2010/0301450 | A1 | 12/2010 | Lin |
| 2011/0031479 | A1 | 2/2011 | Ryu et al. |
| 2011/0057742 | A1 | 3/2011 | Frye et al. |
| 2013/0256711 | A1 | 10/2013 | Joo et al. |
| 2015/0219513 | A1* | 8/2015 | Uematsu ............... G01L 9/0052 29/855 |
| 2015/0255368 | A1 | 9/2015 | Costa |
| 2015/0344697 | A1 | 12/2015 | Nam et al. |
| 2015/0376447 | A1 | 12/2015 | Kawabe et al. |
| 2016/0365699 | A1 | 12/2016 | Lell et al. |
| 2017/0131551 | A1 | 5/2017 | Robbins et al. |
| 2018/0033709 | A1 | 2/2018 | Kuroda et al. |
| 2019/0326234 | A1* | 10/2019 | Benson ............... H01L 23/3677 |

OTHER PUBLICATIONS

Author Unknown, "Liquid Crystal Polymer (Vectra)," Material Properties Sheet, Robison Electronics, Paso Robles, California, published at least as early as Nov. 2, 2017, 1 page.

Cheng, L. et al., "Sub-10 nm Tunable Hybrid Dielectric Engineering on MoS2 for Two-Dimensional Material-Based Devices," ACS Nano, vol. 11, Aug. 23, 2017, ACS Publications, pp. 10243-10252.

Gao, Feng, et al., "Impact of Water-Assisted Electrochemical Reactions on the OFF-State Degradation of AlGaN/GaN HEMTs," IEEE Transactions on Electron Devices, vol. 61, Issue 2, Feb. 2014, pp. 437-444.

Grill, A. et al., "Progress in the development and understanding of advanced low k and ultralow k dielectrics for very large-scale integrated interconnects—State of the art," Applied Physics Reviews, vol. 1, Mar. 2014, AIP Publishing LLC, 18 pages.

Harkonen, Emma, et al., "Corrosion Protection of Steel with Oxide Nanolaminates Grown by Atomic Layer Deposition," Journal of The Electrochemical Society, vol. 158, Issue 11, 2011, pp. C369-C378.

Huang, J. et al., "Hydroquinone-ZnO nano-laminate deposited by molecular-atomic layer deposition," Applied Physics etters, vol. 106, Mar. 2015, AIP Publishing LLC, 6 pages.

Huang, J. et al., "Organic-Inorganic Hybrid Nano-laminates Fabricated by Ozone-assisted Molecular-atomic Layer Deposition," Chemical Vapor Deposition, vol. 19, Jun. 2013, Wiley, pp. 142-148.

Wang, Xuefeng, et al., "Micromachining Techniques for Liquid Crystal Polymer," Micro Electro Mechanical Systems, Jan. 25, 2001, Interlaken, Switzerland, IEEE, 5 pages.

Non-Final Office Action for U.S. Appl. No. 15/797,310, dated Jun. 12, 2018, 16 pages.

Final Office Action for U.S. Appl. No. 15/797,310, dated Oct. 24, 2018, 19 pages.

Advisory Action for U.S. Appl. No. 15/797,310, dated Nov. 30, 2018, 3 pages.

Non-Final Office Action for U.S. Appl. No. 15/797,310, dated Jan. 22, 2019, 17 pages.

Non-Final Office Action for U.S. Appl. No. 15/797,310, dated Mar. 13, 2019, 18 pages.

Final Office Action for U.S. Appl. No. 15/797,310, dated May 21, 2019, 20 pages.

Advisory Action for U.S. Appl. No. 15/797,310, dated Jul. 31, 2019, 3 pages.

Non-Final Office Action for U.S. Appl. No. 15/797,310, dated Aug. 19, 2019, 10 pages.

Final Office Action for U.S. Appl. No. 15/797,310, dated Nov. 1, 2019, 12 pages.

Notice of Allowance for U.S. Appl. No. 15/797,310, dated Dec. 4, 2019, 11 pages.

Non-Final Office Action for U.S. Appl. No. 16/743,345, dated Feb. 19, 2020, 12 pages.

Final Office Action for U.S. Appl. No. 16/743,345, dated Mar. 25, 2020, 14 pages.

Advisory Action for U.S. Appl. No. 16/743,345, dated Jun. 2, 2020, 3 pages.

Notice of Allowance for U.S. Appl. No. 16/743,345, dated Jul. 16, 2020, 9 pages.

* cited by examiner

FLUORINATED POLYMERS WITH LOW DIELECTRIC LOSS FOR ENVIRONMENTAL PROTECTION IN SEMICONDUCTOR DEVICES

RELATED APPLICATIONS

This application claims the benefit of provisional patent application Ser. No. 63/092,282, filed Oct. 15, 2020, the disclosure of which is hereby incorporated herein by reference in its entirety.

FIELD OF THE DISCLOSURE

The present disclosure relates to semiconductor devices, and more particularly to fluorinated polymers with low dielectric loss and low moisture permeability for environmental protection in semiconductor devices.

BACKGROUND

Semiconductor die and integrated circuit packages are used in myriad applications. Often, these applications result in exposure of the semiconductor die and integrated circuit packages to environmental conditions such as high temperature, humidity, and the like. To prolong the lifetime of devices incorporating semiconductor die and integrated circuit packages, environmental protection is paramount. Specifically, protecting semiconductor die and integrated circuit packages from degradation due to moisture ingress is necessary for maintaining reliability of the devices.

Figure 1A:
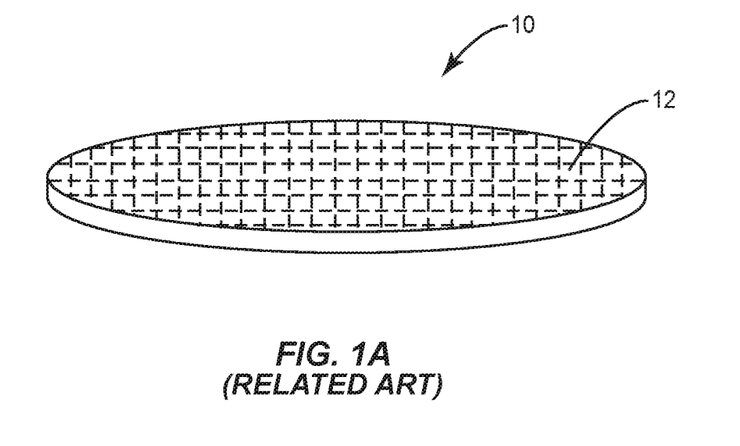
FIG. 1A illustrates a conventional semiconductor wafer which may be subdivided into a number of semiconductor die.
Figure 1B:
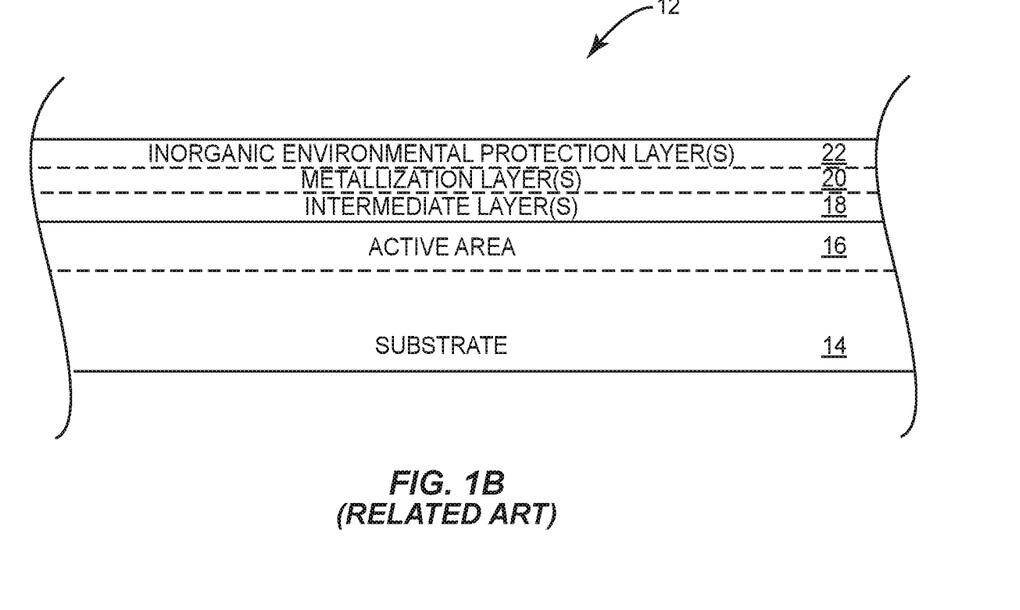
FIG. 1B illustrates a cross-sectional view of a portion of a conventional semiconductor die.

Generally, environmental protection may be applied at the wafer level or the package level. State of the art wafer level environmental protection involves the application of one or more thin film organic and/or inorganic environmental protection layers, as illustrated in FIGS. 1A and 1B. FIG. 1A shows a semiconductor wafer 10, which is separated into a number of discrete semiconductor die 12. FIG. 1B shows a cross-sectional view of a portion of one of the semiconductor die 12, which includes a substrate 14, an active area 16 in a top portion of the substrate 14, one or more intermediate layers 18 over the substrate 14, one or more metallization layers 20 over the one or more intermediate layers 18, and one or more inorganic environmental protection layers 22 over the one or more metallization layers 20. Those skilled in the art will appreciate that the active area 16 may include one or more implanted, diffused, or epitaxially grown regions, and that the one or more intermediate layers 18 and the one or more metallization layers 20 may be patterned to form any number of semiconductor devices in the semiconductor die 12. For example, one or more implanted, diffused, or epitaxial regions in the active area 16 may interact with an intermediate layer 18 of oxide or nitride and one or more portions of a metallization layer 20 to form one or more transistors, one or more diodes, and the like.

Conventionally, the inorganic environmental protection layers 22 are applied via chemical vapor deposition (CVD), or by atomic layer deposition (ALD), and comprise oxides or nitrides such as tantalum pentoxide, aluminum oxide, silicon nitride, or aluminum nitride. While initially promising from an environmental protection perspective, these inorganic environmental protection layers 22 have proved inadequate in harsh environmental conditions. For example, when subjected to highly accelerated stress tests (HAST) in which the device is subject to 85% relative humidity at 130° C. for 96 hours under certain bias conditions or temperature humidity bias (THB) tests in which the device is subject to 85% relative humidity at 85° C. for 1000 hours under certain bias conditions, the device may fail due to moisture ingress and corrosion. Moisture Sensitivity Level (MSL) tests, such as MSL 1, 2, 3, etc., may therefore be employed at different saturated moisture levels to assess longevity of each electronic device in elevated moisture and temperature conditions as defined in the Joint Electron Device Engineering Council standard IPC/JEDEC J-STD-020.

Figure 2:
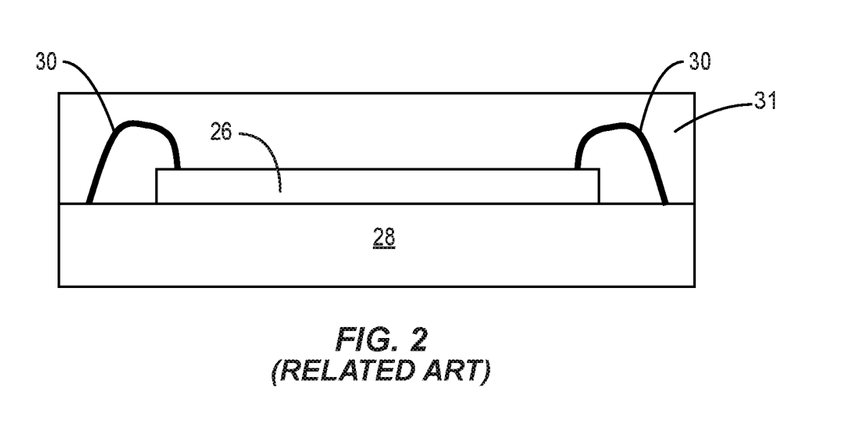
FIG. 2 illustrates a cross-sectional view of a portion of a conventional semiconductor package.

FIG. 2 illustrates state of the art package level environmental protection. As shown, a semiconductor device 24 includes a semiconductor die 26 that is attached to a package substrate 28, and wire bonds 30 that electrically connect the semiconductor die 26 to the package substrate 28. A number of solder balls or other connections may couple the package substrate 28 with a module (not shown), or other circuitry. An encapsulation layer 31 is usually provided over the semiconductor die 26 such that the semiconductor die 26 is completely encapsulated thereby.

Conventionally, the encapsulation layer 31 is an epoxy layer that is extruded or otherwise molded over the package. That is, the encapsulation layer 31 is not a thin film layer and is not provided via a vapor deposition process. While the encapsulation layer 31 of modern packages may serve to reduce moisture ingress, the art continues to seek improved environmental protection with reduced impact on device performance.

SUMMARY

Aspects disclosed herein relate to semiconductor devices, and more particularly to fluorinated polymers with low dielectric loss for environmental protection in semiconductor devices. Arrangements include conformal coatings or layers of fluorinated polymers that cover a semiconductor die on a package substrate of a semiconductor device. Such fluorinated polymer arrangements may also conformally coat various electrical connections for the semiconductor die, including wire bonds. Fluorinated polymers with low dielectric constants and low moisture permeability may thereby provide reduced moisture ingress in semiconductor devices while also reducing the impact of associated dielectric loss.

In one aspect, a semiconductor device comprises: a package substrate; a semiconductor die on the package substrate, the semiconductor die comprising an active area and one or more metallization layers on the active area; and at least one fluorinated polymer layer on the semiconductor die and surfaces of the package substrate that are adjacent the semiconductor die. In certain embodiments, the at least one fluorinated polymer layer comprises a dielectric constant that is in a range from greater than 1 to less than or equal to 3; and the at least one fluorinated polymer layer comprises a water vapor transmission rate that is in a range from $10^{-2}$ grams per square meter per day (g/m$^2$/day) to 103 g/m$^2$/day across a temperature range from 20 degrees Celsius (C) to 100 degrees C. In certain embodiments, the at least one fluorinated polymer layer comprises a thickness in a range from 0.5 μm to 2 μm. In certain embodiments, the semiconductor device comprises at least one wire bond that is electrically connected between the semiconductor die and the package substrate, wherein the at least one fluorinated polymer layer is arranged to conformally coat the at least one wire bond.

In certain embodiments, a region that is defined between the at least one wire bond and the package substrate is devoid of the at least one fluorinated polymer layer. In certain embodiments, the region is bounded by a portion of the at least one fluorinated polymer layer that is on a surface of the package substrate and another portion of at the least one fluorinated polymer layer that is conformal to the at least one wire bond. The semiconductor device may further comprise a mold material that is formed over the semiconductor die and the least one fluorinated polymer layer, wherein a portion of the mold material fills the region that is defined between the at least one wire bond and the package substrate. The semiconductor device may further comprise an additional layer that is arranged between the at least one fluorinated polymer layer and the one or more metallization layers, wherein the additional layer comprises at least one of a planarization layer and a diecoat film. In certain embodiments, the at least one wire bond is arranged to pass through an opening in the additional layer to electrically connect with the semiconductor die; and a portion of the at least one fluorinated polymer layer is arranged within the opening.

In certain embodiments for the semiconductor device, the package substrate comprises a lead frame structure that includes metal leads at least partially embedded in a host material; a surface of the package substrate defines electrical connections for the semiconductor die by way of the metal leads of the lead frame structure; and the at least one fluorinated polymer layer is patterned on the package substrate such that the surface of the package that defines the electrical connections for the semiconductor die is devoid of the at least one fluorinated polymer layer.

The semiconductor device may further comprise a lid on the package substrate that defines upper and side boundaries of an air cavity above the semiconductor die; wherein a lower boundary of the air cavity is defined by the at least one fluorinated polymer layer. In certain embodiments, a portion of the at least one fluorinated polymer layer is arranged between the lid and the package substrate. In certain embodiments, the semiconductor device may further comprise a liquid crystal polymer layer on the at least one fluorinated polymer layer.

In another aspect, a method comprises: providing a semiconductor die on a package substrate, the semiconductor die comprising an active area and one or more metallization layers on the active area; and depositing at least one fluorinated polymer layer on the semiconductor die and on surfaces of the package substrate that are adjacent to the semiconductor die by a vapor deposition process. In certain embodiments, at least one wire bond is electrically connected between the semiconductor die and the package substrate, and the at least one fluorinated polymer layer is arranged to conformally coat the at least one wire bond. In certain embodiments, the at least one fluorinated polymer layer is selectively deposited on portions of the package substrate such that one or more electrical connection surfaces of the package substrate are devoid of the at least one fluorinated polymer layer. In certain embodiments, the at least one fluorinated polymer layer is selectively deposited through a mask that covers the one or more electrical connection surfaces. The method may further comprise encapsulating the semiconductor die and one or more portions of the at least one fluorinated polymer layer with a mold material. In certain embodiments, at least one wire bond is electrically connected between the semiconductor die and the package substrate and a portion of the mold material is arranged between the at least one wire bond and the package substrate. The method may further comprise attaching a lid on the package substrate and over the semiconductor die to form an air cavity over the semiconductor die, wherein the at least one fluorinated polymer layer defines a lower boundary of the air cavity.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

Aspects disclosed herein relate to semiconductor devices, and more particularly to fluorinated polymers with low dielectric loss for environmental protection in semiconductor devices. Arrangements include conformal coatings or layers of fluorinated polymers that cover a semiconductor die on a package substrate of a semiconductor device. Such fluorinated polymer arrangements may also conformally coat various electrical connections for the semiconductor die, including wire bonds. Fluorinated polymers with low dielectric constants and low moisture permeability may thereby provide reduced moisture ingress in semiconductor devices while also reducing the impact of associated dielectric loss.

Figure 3:
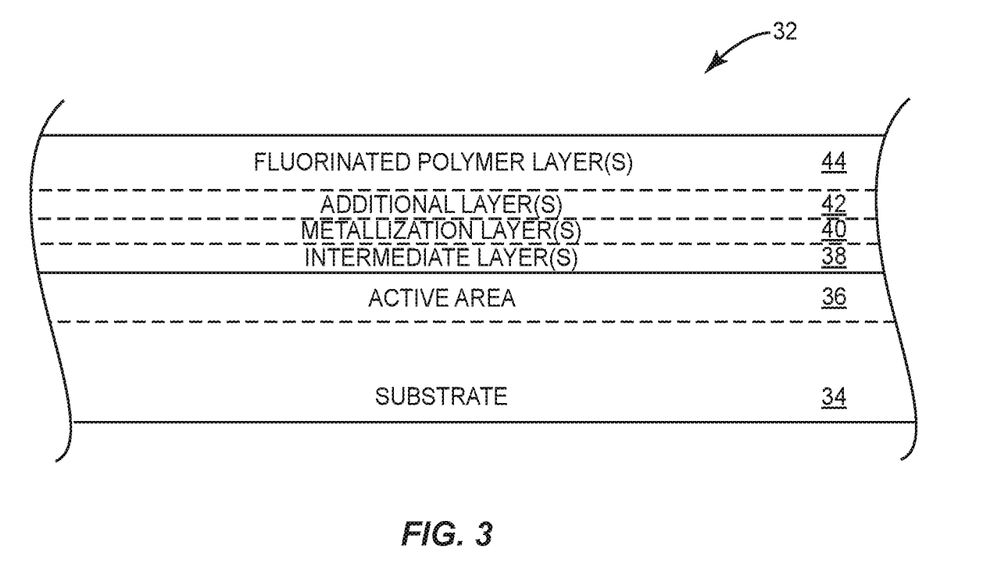
FIG. 3 is a cross-sectional view of a portion of a semiconductor device that includes one or more fluorinated polymer layers according to embodiments of the present disclosure.

FIG. 3 is a cross-sectional view of a portion of a semiconductor device 32 according to embodiments of the present disclosure. The semiconductor device 32 may embody a semiconductor die or a semiconductor package that includes a semiconductor die, including an integrated circuit package for use in radio frequency (RF) applications. As shown, the semiconductor device 32 may include a substrate 34, an active area 36 in or on a top portion of the substrate 34, one or more intermediate layers 38 over the substrate 34, one or more metallization layers 40 over the one or more intermediate layers 38, one or more additional layers 42, and one or more fluorinated polymer layers 44 over the one or more metallization layers 40 and if present, over the one or more additional layers 42. Those skilled in the art will appreciate that the active area 36 may include one or more implanted, diffused, or epitaxially grown regions or layers, and that the one or more intermediate layers 38 and the one or more metallization layers 40 may be patterned to form any number of semiconductor devices in the semiconductor device 32. For example, one or more implanted, diffused, or epitaxial regions in the active area 36 may interact with one or more intermediate layers 38 of oxide and one or more portions of the metallization layers 40 to define one or more transistors, field effect transistors (FETs), one or more diodes, and combinations thereof, among other semiconductor devices. In certain embodiments, the semiconductor device 32 is a device for RF operation. In certain embodiments, the semiconductor device 32 may form a monolithic microwave integrated circuit (MMIC).

The one or more additional layers 42 may represent one or more of further device metallization layers and/or intermediate layers as well as device planarization films, and diecoat films for stress relief and/or scratch protection. In certain embodiments, the one or more additional layers 42 may comprise polymer materials. Planarization films may be provided to cover top surface topology of the metallization layers 40 and/or the intermediate layers 38. Depending on the structure of the active area 36, the planarization film may cover and smooth out differences in topology related to various contact structures, cavities, inductors, and/or capacitors, among other structures.

In certain embodiments, the substrate 34 may comprise gallium nitride (GaN) or gallium arsenide (GaAs). Generally, semiconductor die comprising gallium nitride and gallium arsenide are relatively high-power devices (e.g., rated for blocking voltages greater than 30 V). Those skilled in the art will appreciate that as the power handling capability of a device increases, so does the potential for damage of the device due to environmental exposure. Certain dielectric materials that may provide suitable moisture ingress barriers may also contribute to increased dielectric loss in corresponding semiconductor devices, thereby limiting high frequency operation.

According to aspects of the present disclosure, environmental protection structures for semiconductor devices are configured to provide moisture ingress barriers while also reducing dielectric loss typically associated with conventional materials. In certain aspects, the one or more fluorinated polymer layers 44 may include at least one fluorinated polymer layer that comprises a low dielectric constant value in combination with a low water vapor transmission rate (WVTR), even at elevated temperatures. In certain embodiments, the one or more fluorinated polymer layers 44 comprise a dielectric constant that is less than or equal to 3, or less than or equal to 2.5, or less than or equal to 2, or in a range with any of the aforementioned values as an upper boundary and greater than 1 as a lower boundary. The same one or more fluorinated polymer layers 44 may also comprise a WVTR of less than $10^3$ grams per square meter per day (g/m²/day), or less than $10^2$ g/m²/day, or in a range with either of the aforementioned values as an upper boundary and $10^{-2}$ g/m²/day as a lower boundary across a temperature range from 20 degrees Celsius (C) to 100 degrees C. For the purposes of this disclosure, the WVTR values are determined according to the ASTM F1249 standard test method. By providing the one or more fluorinated polymer layers 44 with a low dielectric constant value in combination with a low WVTR, even at elevated temperatures, the semiconductor device 32 may exhibit low moisture permeability with reduced dielectric loss associated with other dielectric materials. In this regard, the semiconductor device 32 may exhibit enhanced highly accelerated stress test (HAST) performance and improved moisture sensitivity level (MSL) testing.

In certain embodiments, exemplary materials for the one or more fluorinated polymer layers 44 may include any number of fluoropolymers, fluoroelastomers, fluorocarbons, polytetrafluoroethylene (PTFE), perfluoroelastomers (FFKM), methylfluoroalkoxy (MFA), and perfluoroalkoxy alkanes (PFA), among others. Such fluorinated polymer layers 44 may form a conformal coating over one or more portions of the semiconductor device 32, including one or more portions of the additional layers 42 (if present), one or more portions of the metallization layers 40, and the intermediate layers 38. Notably, the one or more fluorinated polymer layers 44 may embody thin-film layers deposited by a vapor deposition process such as low pressure, plasma-enhanced chemical vapor deposition (LP-PECVD), chemical vapor deposition (CVD), molecular vapor deposition (MVD), or molecular layer deposition (MLD). In other embodiments, the one or more fluorinated polymer layers 44 may be applied by way of a spray or spin coating process over one or more portions of the semiconductor device 32. In certain embodiments, the one or more fluorinated polymer layers 44 may comprise a thickness that is less than 5 microns (μm), or less than 2 μm, or in a range from 1 μm to 5 μm, or in a range from 1 μm to 2 μm, or in a range from 0.5 μm to 2 μm.

Figure 4A:
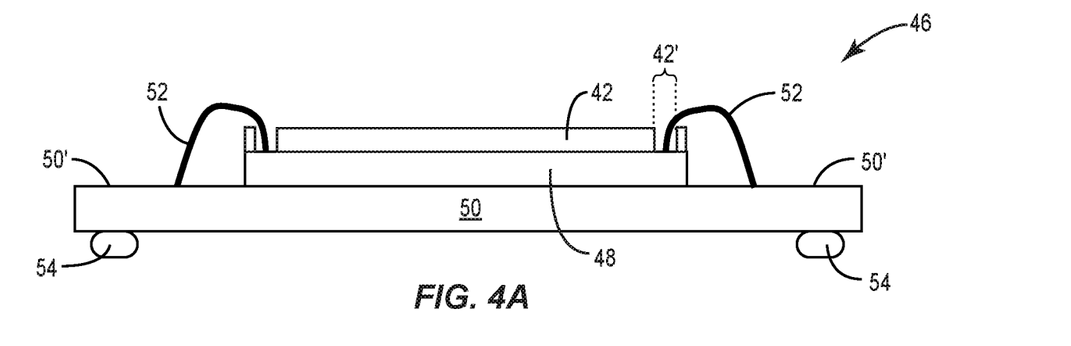
FIG. 4A is cross-sectional view of a semiconductor device at a fabrication step where a semiconductor die has been attached to a package substrate and electrically connected to the package substrate by way of the one or more wire bonds.
Figure 4B:
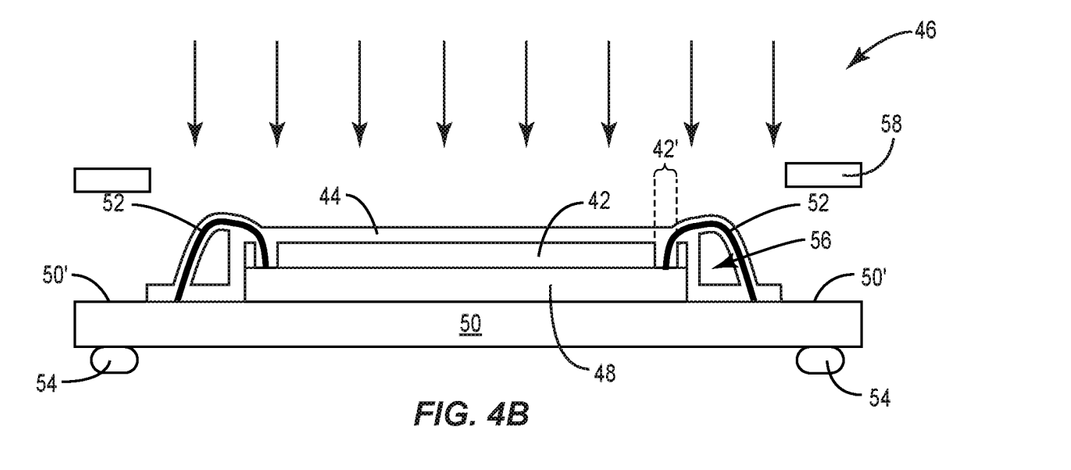
FIG. 4B is a cross-sectional view of the semiconductor device of FIG. 4A during formation of one or more fluorinated polymer layers on the semiconductor die.
Figure 4C:
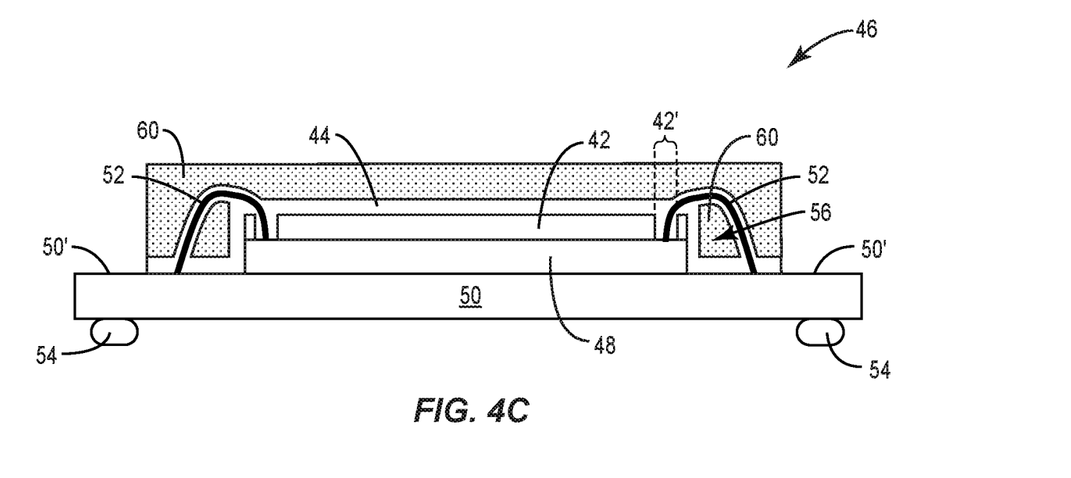
FIG. 4C is a cross-sectional view of the semiconductor device of FIG. 4B after a mold material is formed over the semiconductor die.

FIGS. 4A to 4C are cross-sectional views at sequential fabrication steps for a semiconductor device 46 that includes the one or more fluorinated polymer layers 44. The semiconductor device 46 includes a semiconductor die 48 on a package substrate 50. The semiconductor die 48 may include the substrate 34, the active area 36, the one or more intermediate layers 38, and the one or more metallization layers 40 as previously described for FIG. 3. In certain embodiments, the semiconductor die 48 may embody an RF device, such as a MMIC, for high frequency operation. The one or more additional layers 42 are illustrated on a top surface of the semiconductor die 48 that is opposite a bottom surface of the semiconductor die 48 that is attached to the package substrate 50. As illustrated, the one or more additional layers 42 may form one or more openings 42' that allow wire bonds 52 to extend through the one or more additional layers 42. In this manner, the wire bonds 52 may electrically connect the semiconductor die 48 with corresponding electrical connections, such as traces, that reside on or in the package substrate 50. In certain embodiments, the package substrate 50 may embody a lead frame structure, such as an arrangement where metal leads are at least partially embedded within a host material, such as a mold. In other embodiments, the package substrate 50 may embody other substrate materials, such as ceramic boards, printed circuit boards, and the like. The package substrate 50 may be configured to be mounted or otherwise attached to other circuitry, such as a larger printed circuit board, by way of a number of solder balls 54. Depending on the application, the solder balls 54 may form a ball grid array (BGA).

FIG. 4A is cross-sectional view of the semiconductor device 46 at a fabrication step where the semiconductor die 48 has been attached to the package substrate 50 and electrically connected thereto by way of the one or more wire bonds 52. As described above, when the one or more additional layers 42 are present, the openings 42' may be formed to provide access for the wire bonds 52.

FIG. 4B is a cross-sectional view of the semiconductor device 46 of FIG. 4A during formation of the one or more fluorinated polymer layers 44. As described above, the one or more fluorinated polymer layers 44 may embody thin-film layers deposited by a vapor deposition process such as LP-PECVD, CVD, MVD, or MLD. In other embodiments, the one or more fluorinated polymer layers 44 may be applied by way of a spray or spin coating process. Notably, deposition of the one or more fluorinated polymer layers 44 may be performed at the package level, thereby providing a conformal coating of the one or more fluorinated polymer layers 44. As illustrated, the one or more fluorinated polymer layers 44 may conformally coat portions of the semiconductor die 48, the openings 42' of the additional layers 42, portions of the package substrate 50 that are adjacent the semiconductor die 48, and the wire bonds 52. As illustrated, the one or more fluorinated polymer layers 44 may reside within the opening 42' to fill the space of the openings 42' that are not otherwise occupied by the wire bonds 52.

In certain embodiments, the wire bonds 52 may include a diameter that is greater than a thickness of the one or more fluorinated polymer layers 44. In a specific example, the diameter of the wire bonds 52 may be about 25 μm and the one or more fluorinated polymer layers 44 may have a thickness in a range from 0.5 μm to about 2 μm. In this manner, regions 56 that are defined underneath the wire bonds 56, or vertically aligned between the wire bonds 52 and the underlying package substrate 50, may not be entirely coated by the one or more fluorinated polymer layers 44 after the deposition. Accordingly, a gap in the one or more fluorinated polymer layers 44 may be registered at the regions 56, where the gap is bounded by portions of the one or more fluorinated polymer layers 44 that are on a surface of the package substrate 50 and other portions of the one or more fluorinated polymer layers 44 that conformally coat bottom portions of the wire bonds 52. In certain embodiments, such as when the package substrate 50 embodies a lead frame structure, one or more surfaces 50' of the package substrate 50 may include or otherwise define an electrical connection surface to the metal leads of the lead frame structure of the semiconductor device 46. Accordingly, the one or more fluorinated polymer layers 44 may be patterned on the package substrate 50 such that the surfaces 50' are devoid of the one or more fluorinated polymer layers 44. This may be performed by selective deposition through a patterned mask 58 as illustrated in FIG. 4B. Alternatively, the one or more fluorinated polymer layers 44 may be patterned by a selective removal process, such as etching.

FIG. 4C is a cross-sectional view of the semiconductor device 46 of FIG. 4B after a mold material 60 is formed over the semiconductor die 48. The mold material 60 may form an encapsulation for the semiconductor die 48, the wire bonds 52, and the one or more fluorinated polymer layers 44. In certain embodiments, the mold material 60 may be applied by various procedures, such as sheet molding, overmolding, compression molding, transfer molding, dam fill encapsulation, or screen print encapsulation. As illustrated, the mold material 60 may be arranged such that the surfaces 50' of the package substrate 50 that correspond to electrical connections for the semiconductor device 46 are accessible. Notably, the mold material 60 may be arranged to fill or otherwise reside in the regions 56 that are between the wire bonds 56 and the underlying package substrate 50. In this manner, the portion of the mold material 60 that is in the regions 56 may be separated from both the wire bonds 52 and the package substrate 50 by portions of the one or more fluorinated polymer layers 44. Additionally, such an arrangement of the mold material 60 may further enhance mechanical support of the wire bonds 52.

While the above embodiments describe arrangements of fluorinated polymer layers for semiconductor die that are encapsulated in a mold material, the principled disclosed are applicable to other semiconductor device arrangements. For example, fluorinated polymer layers according to the present disclosure may be arranged in semiconductor devices that include air cavity structures. An air cavity over one or more portions of discrete circuit elements may provide a low dielectric constant environment during operation. In particular, such air cavities for RF devices may provide high frequency enhancements during operation.

Figure 5:
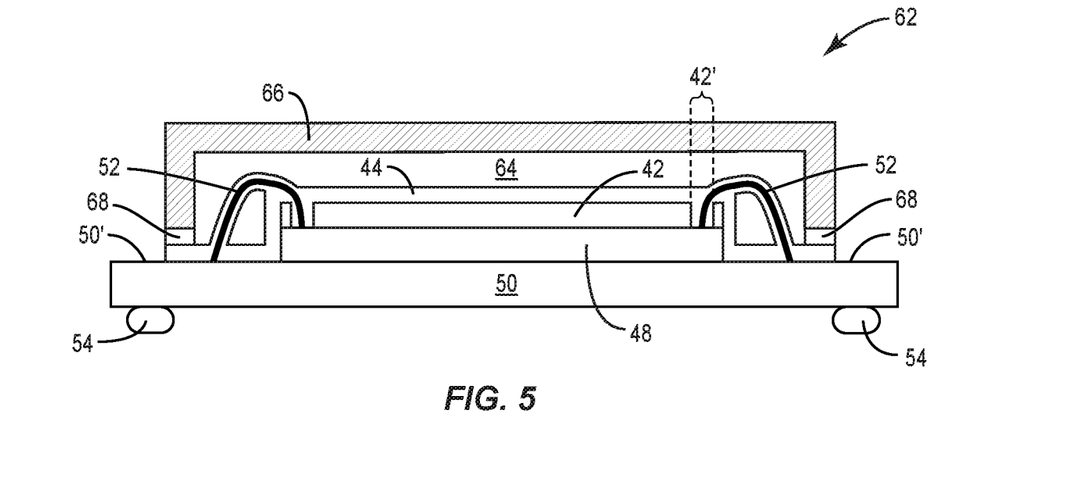
FIG. 5 is a cross-sectional view of a semiconductor device that includes one or more fluorinated polymer layers on a semiconductor die and an air cavity that surrounds portions of the semiconductor die over a package substrate.

FIG. 5 is a cross-sectional view of a semiconductor device 62 that includes an air cavity 64 that surrounds portions of the semiconductor die 48 over the package substrate 50. As illustrated, the semiconductor die 48, the one or more additional layers 42, the one or more fluorinated polymer layers 44, and the wire bonds 52 may be arranged as previously described for FIGS. 4A to 4C. The semiconductor device 62 may further comprise a lid 66 that covers the semiconductor die 48 over the package substrate 50. The lid 66 may comprise one or more insulating materials and/or RF absorptive materials to minimize reflection and transmission, such as laminates, polyester materials, and the like. The lid 66 may be attached to the package substrate 50 by way of an adhesive material 68, such as an epoxy or the like. As illustrated in FIG. 5, the one or more fluorinated polymer layers 44 conformally coat the semiconductor die 48, the wire bonds 52, and portions of the package substrate 50 that are laterally adjacent the semiconductor die 48. In certain embodiments, the one or more fluorinated polymer layers 44 are arranged between the lid 66 and the package substrate 50 such that the lid 66 is mounted or otherwise attached to the one or more fluorinated polymer layers 44. In further embodiments, the one or more fluorinated polymer layers 44 may be arranged to conformally coat all surfaces underneath the air cavity 64. In this regard, upper and side boundaries of the air cavity 64 are defined by the lid 66 and a lower boundary of the air cavity 64 is defined by the one or more fluorinated polymer layers 44.

Figure 6:
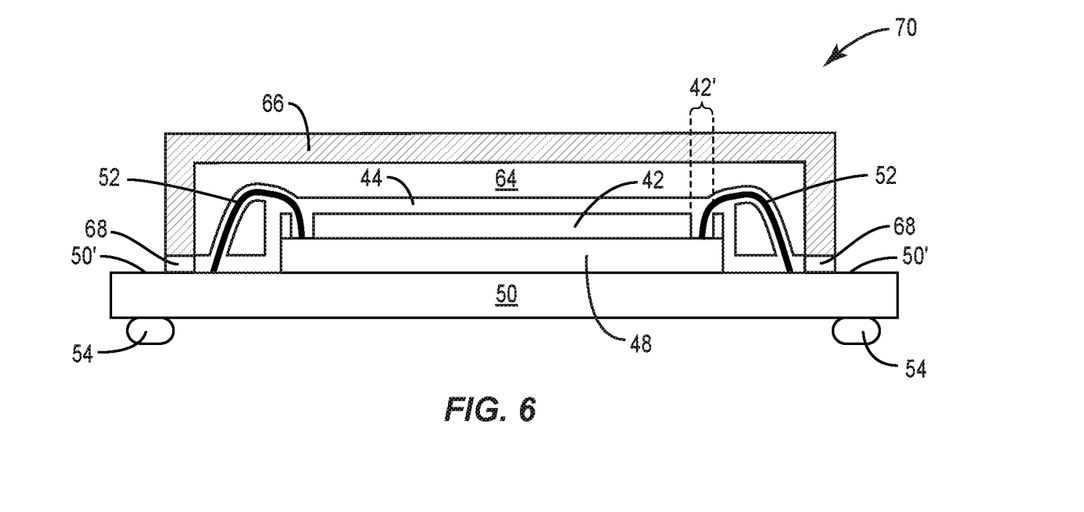
FIG. 6 is a cross-sectional view of a semiconductor device that is similar to the semiconductor device of FIG. 5, but for embodiments where a lid is attached to a package substrate without the one or more fluorinated polymer layers being arranged therebetween.

FIG. 6 is a cross sectional view of a semiconductor device 70 that is similar to the semiconductor device 62 of FIG. 5, but for embodiments where the lid 66 is attached to the package substrate 50 without the one or more fluorinated polymer layers 44 being arranged therebetween. In this manner, the one or more fluorinated polymer layers 44 may be patterned on the package substrate 50 to provide clearance for both the surfaces 50' that correspond to electrical connections and other surfaces of the package substrate 50 that correspond to mounting locations for the lid 66. As with FIG. 5, the one or more fluorinated polymer layers 44 may be arranged to conformally coat all surfaces underneath the air cavity 64 such that the air cavity 64 is defined and/or bounded by the lid 66 and the one or more fluorinated polymer layers 44.

Figure 7:
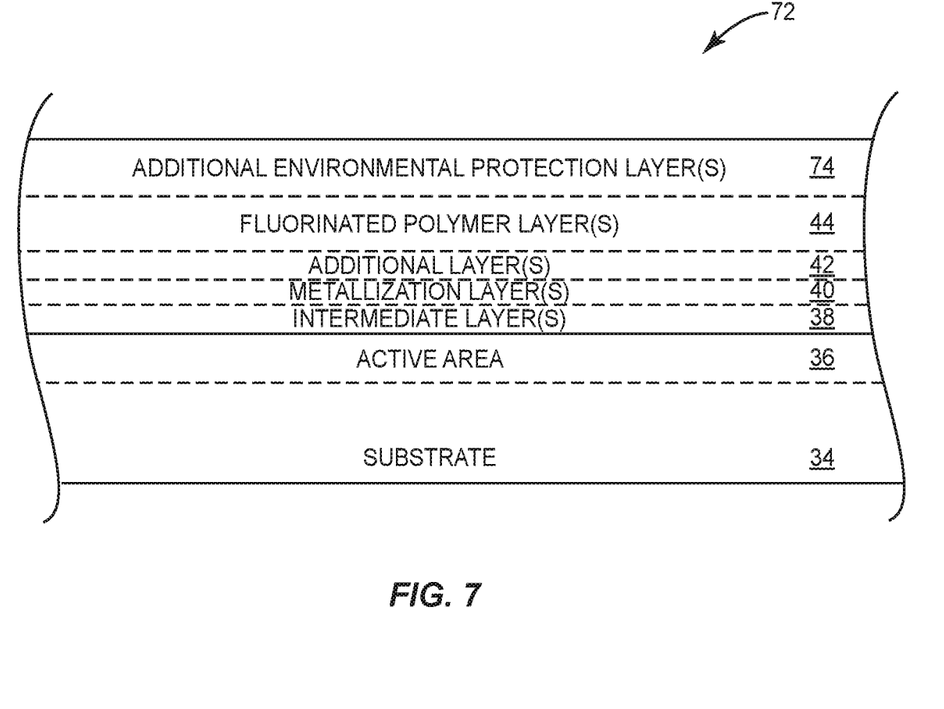
FIG. 7 is a cross-sectional view of a portion of a semiconductor device that is similar to the semiconductor device of FIG. 3 and further includes one or more additional environmental protection layers on the one or more fluorinated polymer layers.

FIG. 7 is a cross-sectional view of a portion of a semiconductor device 72 that is similar to the semiconductor device 32 of FIG. 3 and further includes one or more additional environmental protection layers 74 on the one or more fluorinated polymer layers 44. The one or more additional environmental protection layers 74 may include a layer that is separate from the one or more fluorinated polymer layers 44. For example, the one or more additional environmental protection layers 74 may include at least one additional moisture barrier layer that resides on the one or more fluorinated polymer layers 44 and the metallization layers 40. The one or more additional environmental protection layers 74 may include a conformal organic layer, such as a liquid crystal polymer (LCP). In this regard, the one or more fluorinated polymer layers 44 may provide a first moisture barrier with a low dielectric constant material and the one or more additional environmental protection layers 74 may provide a second moisture barrier, wherein the first moisture barrier is arranged between the metallization layers 40 and the second moisture barrier. While the one or more additional environmental protection layers 74 may have a higher dielectric constant than the fluorinated polymer layers 44, the presence of the one or more fluorinated polymer layers 44 may allow a lower thickness or quantity of the higher dielectric constant material in the semiconductor device 72. The semiconductor device 72 may be implemented in any of the previously described embodiments, including the molded devices as illustrated in FIGS. 4A to 4C and the air cavity devices as illustrated in FIGS. 5 and 6.

As described above, aspects of the present disclosure relate to fluorinated polymer layers as coatings and/or encapsulation layers in semiconductor devices. The fluorinated polymer layers advantageously provide a combination of a low dielectric constant material and low moisture permeability, thereby providing enhanced environmental protection with reduced dielectric loss in corresponding semiconductor devices, such as RF devices. The fluorinated polymer layers may be arranged in molded devices as illustrated in FIGS. 4A to 4C and in air cavity devices as illustrated in FIGS. 5 and 6.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A semiconductor device comprising:
a package substrate;
a semiconductor die on the package substrate, the semiconductor die comprising an active area and one or more metallization layers on the active area;
at least one fluorinated polymer layer on the semiconductor die and surfaces of the package substrate that are adjacent the semiconductor die;
at least one wire bond electrically connected between the semiconductor die and the package substrate, the at least one fluorinated polymer layer being arranged to conformally coat the at least one wire bond; and
an additional layer arranged between the at least one fluorinated polymer layer and the one or more metallization layers, the additional layer comprising at least one of a planarization layer and a diecoat film;
wherein the at least one wire bond is arranged to pass through an opening in the additional layer to electrically connect with the semiconductor die, and a portion of the at least one fluorinated polymer layer is arranged within the opening.

2. The semiconductor device of claim 1, wherein:
the at least one fluorinated polymer layer comprises a dielectric constant that is in a range from greater than 1 to less than or equal to 3; and
the at least one fluorinated polymer layer comprises a water vapor transmission rate that is in a range from $10^{-2}$ grams per square meter per day (g/m²/day) to $10^3$ g/m²/day across a temperature range from 20 degrees Celsius (C) to 100 degrees C.

3. The semiconductor device of claim 2, wherein the at least one fluorinated polymer layer comprises a thickness in a range from 0.5 μm to 2 μm.

4. The semiconductor device of claim 1, wherein a region that is defined between the at least one wire bond and the package substrate is devoid of the at least one fluorinated polymer layer.

5. The semiconductor device of claim 4, wherein the region is bounded by a portion of the at least one fluorinated polymer layer that is on a surface of the package substrate and another portion of at least one fluorinated polymer layer that is conformal to the at least one wire bond.

6. The semiconductor device of claim 5, further comprising a mold material that is formed over the semiconductor die and the least one fluorinated polymer layer, wherein a portion of the mold material fills the region that is defined between the at least one wire bond and the package substrate.

7. The semiconductor device of claim 1, wherein:
the package substrate comprises a lead frame structure that includes metal leads at least partially embedded in a host material;
a surface of the package substrate defines electrical connections for the semiconductor die by way of the metal leads of the lead frame structure; and
the at least one fluorinated polymer layer is patterned on the package substrate such that the surface of the package substrate that defines the electrical connections for the semiconductor die is devoid of the at least one fluorinated polymer layer.

8. The semiconductor device of claim 1, further comprising:
a lid on the package substrate that defines upper and side boundaries of an air cavity above the semiconductor die;
wherein a lower boundary of the air cavity is defined by the at least one fluorinated polymer layer.

9. The semiconductor device of claim 8, wherein a portion of the at least one fluorinated polymer layer is arranged between the lid and the package substrate.

10. The semiconductor device of claim 1, further comprising a liquid crystal polymer layer on the at least one fluorinated polymer layer.

11. A method comprising:
providing a semiconductor die on a package substrate, the semiconductor die comprising an active area and one or more metallization layers on the active area, wherein at least one wire bond is electrically connected between the semiconductor die and the package substrate; and
depositing at least one fluorinated polymer layer on the semiconductor die and on surfaces of the package substrate that are adjacent the semiconductor die by a vapor deposition process, wherein the at least one fluorinated polymer layer is arranged to conformally coat the at least one wire bond;
wherein an additional layer is arranged between the at least one fluorinated polymer layer and the one or more metallization layers, the additional layer comprising at least one of a planarization layer and a diecoat film; and
wherein the at least one wire bond is arranged to pass through an opening in the additional layer to electrically connect with the semiconductor die, and a portion of the at least one fluorinated polymer layer is arranged within the opening.

12. The method of claim 11, wherein the at least one fluorinated polymer layer is selectively deposited on portions of the package substrate such that one or more electrical connection surfaces of the package substrate are devoid of the at least one fluorinated polymer layer.

13. The method of claim 12, wherein the at least one fluorinated polymer layer is selectively deposited through a mask that covers the one or more electrical connection surfaces.

14. The method of claim 11, further comprising encapsulating the semiconductor die and one or more portions of the at least one fluorinated polymer layer with a mold material.

15. The method of claim 14, wherein a portion of the mold material is arranged between the at least one wire bond and the package substrate.

16. The method of claim 11, further comprising attaching a lid on the package substrate and over the semiconductor die to form an air cavity over the semiconductor die, wherein the at least one fluorinated polymer layer defines a lower boundary of the air cavity.

* * * * *